(12) United States Patent
Park et al.

(10) Patent No.: US 11,050,409 B2
(45) Date of Patent: Jun. 29, 2021

(54) ACOUSTIC RESONATOR AND ACOUSTIC RESONATOR FILTER

(71) Applicant: Samsung Electro-Mechanics Co., Ltd., Suwon-si (KR)

(72) Inventors: Yoon Sok Park, Suwon-si (KR); Dong Hoe Kim, Suwon-si (KR); Tah Joon Park, Suwon-si (KR); Won Kyu Jeung, Suwon-si (KR); Nam Jung Lee, Suwon-si (KR)

(73) Assignee: Samsung Electro-Mechanics Co., Ltd., Suwon-si (KR)

(*) Notice: Subject to any disclaimer, the term of this patent is extended or adjusted under 35 U.S.C. 154(b) by 0 days.

(21) Appl. No.: 16/525,758

(22) Filed: Jul. 30, 2019

(65) Prior Publication Data

US 2020/0336131 A1  Oct. 22, 2020

(30) Foreign Application Priority Data

Apr. 16, 2019  (KR) .................. 10-2019-0044184

(51) Int. Cl.
*H03H 9/54* (2006.01)
*H03H 9/02* (2006.01)
*H03H 9/15* (2006.01)

(52) U.S. Cl.
CPC .......... *H03H 9/54* (2013.01); *H03H 9/02007* (2013.01); *H03H 9/15* (2013.01); *H03H 2009/02173* (2013.01)

(58) Field of Classification Search
CPC ........ H03H 9/54; H03H 9/02007; H03H 9/15; H03H 9/02173
See application file for complete search history.

(56) References Cited

U.S. PATENT DOCUMENTS

| 2007/0152775 | A1  | 7/2007  | Fujii et al. |
| 2008/0042780 | A1* | 2/2008  | Lee ................... H03H 9/02118 333/187 |
| 2008/0129417 | A1* | 6/2008  | Taniguchi ............ H03H 9/174 333/192 |
| 2009/0206706 | A1  | 8/2009  | Iwaki et al. |
| 2017/0373665 | A1* | 12/2017 | Lee .................... H03H 9/13 |
| 2019/0115901 | A1* | 4/2019  | Takahashi ........... H03H 9/564 |

FOREIGN PATENT DOCUMENTS

| JP | 2009-200714 A    | 9/2009 |
| WO | WO 2006/027873 A1 | 3/2006 |

* cited by examiner

*Primary Examiner* — Samuel S Outten
(74) *Attorney, Agent, or Firm* — NSIP Law

(57) ABSTRACT

An acoustic resonator includes: an upper electrode including a first active region disposed on an upper portion of a piezoelectric layer, and a first extended region extended from the first active region; a lower electrode including a second active region disposed on a lower portion of the piezoelectric layer, and a second extended region extended from the second active region; a first metal layer including a first resistance reduction region disposed on the first extended region; and a second metal layer including a second resistance reduction region disposed on the second extended region. The first metal layer includes a first conductive link region extended from the first resistance reduction region. The second metal layer includes a second conductive link region extended from the second resistance reduction region. The first and second conductive link regions correspond to respective portions of a side boundary of the first and second active regions.

14 Claims, 9 Drawing Sheets

ACOUSTIC RESONATOR AND ACOUSTIC RESONATOR FILTER

CROSS-REFERENCE TO RELATED APPLICATIONS

This application claims the benefit under 35 U.S.C. § 119(a) of Korean Patent Application No. 10-2019-0044184 filed on Apr. 16, 2019 in the Korean Intellectual Property Office, the entire disclosure of which is incorporated herein by reference for all purposes.

BACKGROUND

1. Field

The following description relates to an acoustic resonator and an acoustic resonator filter.

2. Description of Related Art

Recently, as mobile communications devices, chemical and biological devices, and the like, have developed rapidly, demand for compact and lightweight filters, oscillators, resonant elements, and acoustic resonant mass sensors, which are used for such devices, are also growing.

An acoustic resonator may be configured as a device for implementing such compact and lightweight filters, oscillators, resonant elements, acoustic resonance mass sensors, and the like, and may be provided as a film bulk acoustic resonator (FBAR).

The FBAR has the advantages that mass production is possible at minimal cost, and a significantly small size is achievable. Moreover, a high quality factor (Q) value, which is a main characteristic of the filter, is achievable, and the resonator may be used even in a microwave frequency band. For example, the resonator may be used even in personal communication system (PCS) and digital cordless system (DCS) bands.

An acoustic resonator and an acoustic resonator filter may have bandpass characteristics, or bandstop characteristics, corresponding to a resonant frequency. Thickness of a bulk acoustic resonator and a bulk acoustic resonator filter may correspond to a wavelength corresponding to a resonant frequency, and thus are required to be thin to increase a pass band or a stop band of a high frequency signal.

However, because a reduction in the total thickness of a bulk acoustic resonator and a bulk acoustic resonator filter may cause a reduction in the thickness of upper and lower electrode causing a reduction in the cross sectional area of an electrical path or a reduction in a size of a resonant portion in a vertical direction, insertion loss may be increased.

SUMMARY

This Summary is provided to introduce a selection of concepts in simplified form that are further described below in the Detailed Description. This Summary is not intended to identify key features or essential features of the claimed subject matter, nor is it intended to be used as an aid in determining the scope of the claimed subject matter.

In one general aspect, an acoustic resonator includes: a piezoelectric layer; an upper electrode including a first active region disposed on an upper portion of the piezoelectric layer, and a first extended region extended from the first active region in a first lateral direction; a lower electrode including a second active region disposed on a lower portion of the piezoelectric layer, and a second extended region extended from the second active region in a second lateral direction; a first metal layer including a first resistance reduction region electrically connected to the first extended region of the upper electrode and disposed on an upper portion of the first extended region; and a second metal layer including a second resistance reduction region electrically connected to the second extended region of the lower electrode and disposed on an upper portion of the second extended region. The first metal layer further includes a first conductive link region extended to correspond to a portion of a side boundary of the first and second active regions from the first resistance reduction region. The second metal layer further includes a second conductive link region extended to correspond to another portion of the side boundary of the first and second active regions from the second resistance reduction region.

The upper electrode may further include a first expansion region expanded from the first active region in a third lateral direction. The lower electrode may further include a second expansion region expanded from the second active region in a fourth lateral direction. The first conductive link region of the first metal layer may be in contact with the first expansion region, and may be disposed on an upper portion of the first expansion region. A second conductive link region of the second metal layer may be in contact with the second expansion region, and may be disposed on an upper portion of the second expansion region.

The first conductive link region may be extended to overlap a portion of a side boundary of the first and second active regions. The second conductive link region may be extended to overlap another portion of the side boundary of the first and second active regions.

Each of the first and second active regions may have a polygonal shape. Each of the first and second conductive link regions may surround different sides of the polygonal shape.

The first conductive link region may have at least one bent form. The second conductive link region may have at least one bent form.

Resistivity of the first metal layer may be lower than resistivity of the upper electrode. Resistivity of the second metal layer may be lower than resistivity of the lower electrode.

A thickness, in a vertical direction, of the first resistance reduction region of the first metal layer may be greater than a thickness, in the vertical direction, of the first extended region of the upper electrode. A thickness, in the vertical direction, of the second resistance reduction region of the second metal layer may be greater than a thickness, in the vertical direction, of the second extended region of the lower electrode.

The acoustic resonator may further include an insertion layer disposed between the piezoelectric layer and the upper electrode, or between the piezoelectric layer and the lower electrode.

The acoustic resonator may further include: a substrate disposed on a lower portion of the lower electrode; a membrane layer disposed between the substrate and the lower electrode to form a cavity between the substrate and the lower electrode; and an etch stop portion disposed on lower portions of the first and second metal layers outside the cavity.

The first metal layer may further include a first frame protruding in a vertical direction, and disposed over the first conductive link region and the first resistance reduction region to at least partially surround the first and second active regions. The second metal layer may further include a second frame protruding in the vertical direction, and disposed over the second conductive link region and the second resistance reduction region to at least partially surround the first and second active regions.

In another general aspect, an acoustic resonator filter includes first, second, and third acoustic resonators electrically connected to each other. The second acoustic resonator includes: a piezoelectric layer; an upper electrode including a first active region disposed on an upper portion of the piezoelectric layer, and a first extended region extended from the first active region in a first lateral direction; a lower electrode including a second active region disposed on a lower portion of the piezoelectric layer, and a second extended region extended from the second active region in a second lateral direction; a first metal layer including a first resistance reduction region electrically connecting the first extended region of the upper electrode to the first acoustic resonator and disposed on an upper portion of the first extended region, and a first conductive link region extended from the first resistance reduction region and corresponding to a portion of a side boundary of the first and second active regions; and a second metal layer including a second resistance reduction region electrically connecting the second extended region of the lower electrode to the third acoustic resonator, and disposed on an upper portion of the second extended region, and a second conductive link region extended from the second resistance reduction region and corresponding to another portion of the side boundary of the first and second active regions.

The first metal layer may further include a third conductive link region surrounding a portion of an active region of the first acoustic resonator. The second metal layer may further include a fourth conductive link region surrounding a portion of an active region of the third acoustic resonator.

The first and third conductive link regions may be disposed at opposite sides among sides of the first resistance reduction region extending in the first and second lateral directions. The second and fourth conductive link regions may be disposed at a same side of the second resistance reduction region extending in the first and second lateral directions.

Each of the first metal layer and the second metal layer may have a thickness in a vertical direction that is greater than a thickness of each of the first extended region and the second extended region in the vertical direction.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1A:
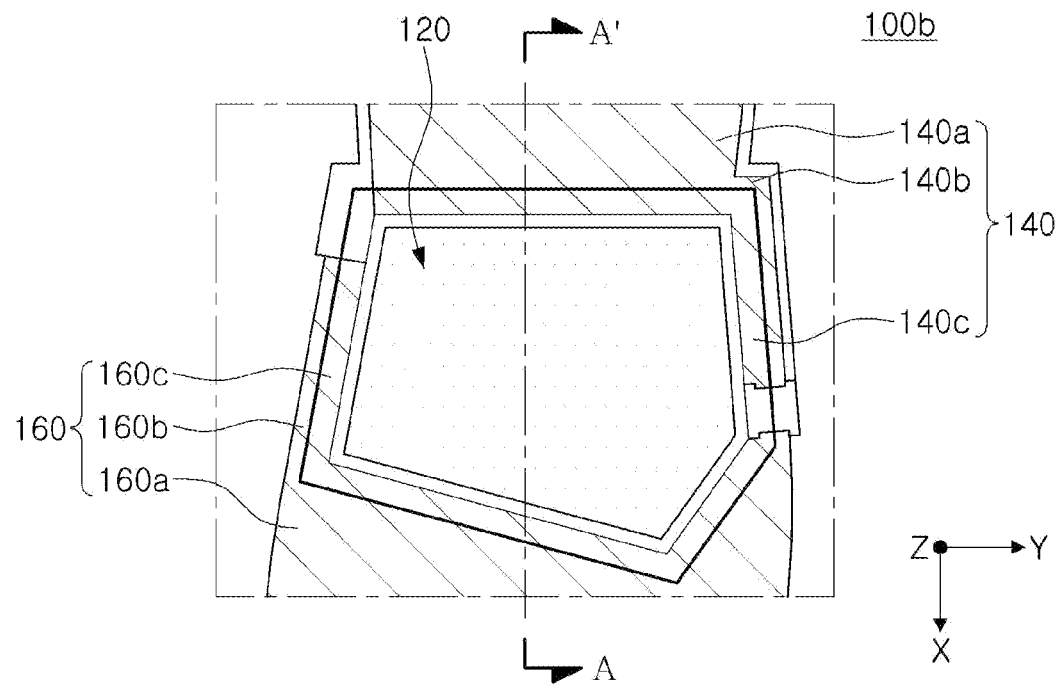
FIG. 1A is a plan view of an acoustic resonator, according to an embodiment.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Herein, it is noted that use of the term "may" with respect to an example or embodiment, e.g., as to what an example or embodiment may include or implement, means that at least one example or embodiment exists in which such a feature is included or implemented while all examples and embodiments are not limited thereto.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Figure 2:
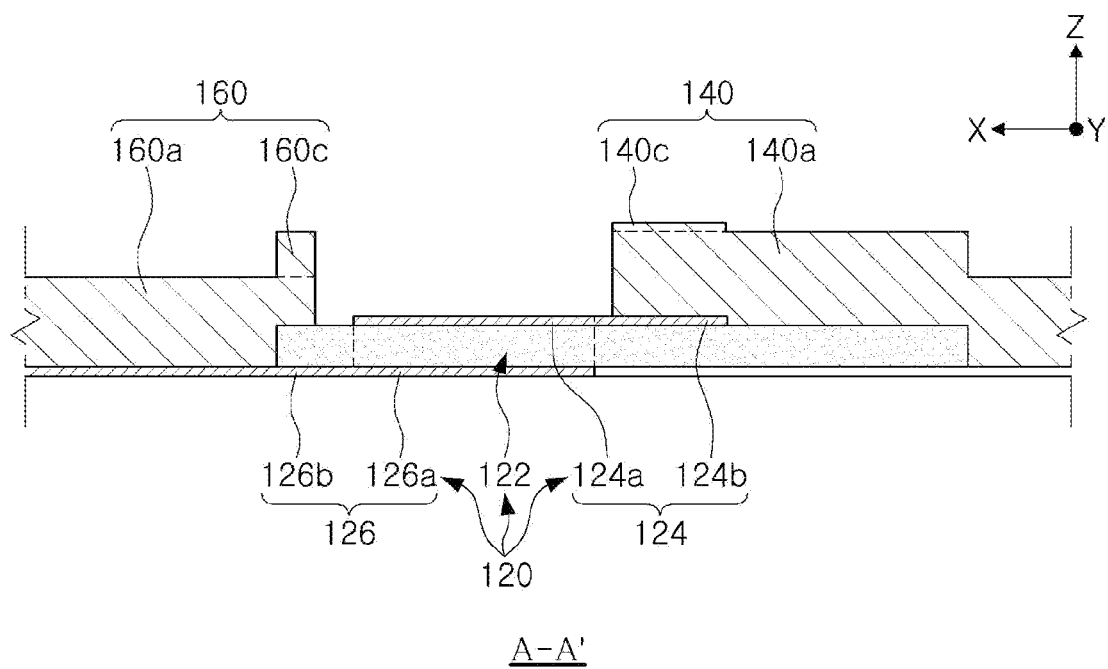
FIG. 2 is a cross-sectional view of an acoustic resonator, according to an embodiment.

FIG. 1A is a plan view of an acoustic resonator 100b, according to an embodiment. FIG. 2 is a cross-sectional view of the acoustic resonator 100b, according to an embodiment.

Referring to FIGS. 1A and 2, the acoustic resonator 100b includes a piezoelectric layer 122, an upper electrode 124, a lower electrode 126, a first metal layer 140, and a second metal layer 160.

The piezoelectric layer 122 may include a piezoelectric material to cause a piezoelectric effect to convert electrical energy into mechanical energy in the form of elastic waves. For example, the piezoelectric material may include any one of aluminum nitride (AlN), zinc oxide (ZnO), and lead zirconium titanium oxide (PZT; PbZrTiO), may further include either one or both of a rare earth metal and a transition metal, and may also include magnesium (Mg), which is a divalent metal. For example, the rare earth metal may include any one or any combination of any two or more of scandium (Sc), erbium (Er), yttrium (Y), and lanthanum (La), and the transition metal may include any one or any combination of any two or more of titanium (Ti), zirconium (Zr), hafnium (Hf), tantalum (Ta), and niobium (Nb).

The upper electrode 124 includes a first active region 124a disposed on an upper portion of the piezoelectric layer 122, and a first extended region 124b extended from the first active region 124a in a first lateral direction (for example: -x direction). The first extended region 124b may be used as either one of an input electrode and an output electrode, inputting or outputting, respectively, an electrical signal such as a radio frequency (RF) signal, or the like.

The lower electrode 126 includes a second active region 126a disposed in a lower portion of the piezoelectric layer 122, and a second extended region 126b extended from the second active region 126a in a second lateral direction (for example: x direction). The second extended region 126b may be used as the other one of the input electrode and the output electrode, inputting or outputting, respectively, an electrical signal such as an RF signal, or the like.

The upper electrode 124 and the lower electrode 126 may be formed of a conductive material such as molybdenum (Mo) or alloys thereof to improve the combination efficiency with the piezoelectric layer 122. However, the upper electrode 124 and the lower electrode 126 are not limited Mo or alloys thereof, and may be formed of a conductive material such as ruthenium (Ru), tungsten (W), iridium (Ir), platinum (Pt), copper (Cu), titanium (Ti), tantalum (Ta), nickel (Ni), chromium (Cr), or the like, or alloys thereof.

The first active region 124a and the second active region 126a overlap in a vertical direction (for example: z direction) with the piezoelectric layer 122, thereby providing electrical energy to the piezoelectric layer 122 or receiving electrical energy from the piezoelectric layer 122.

A combined structure of the first active region 124a and the second active region 126a with the piezoelectric layer 122 is provided to resonate with respect to electric energy of a specific frequency passing between the upper electrode 124 and the lower electrode 126, thereby significantly interfering in passing of electric energy having a specific frequency.

Thus, a combination of the first active region 124a and the second active region 126a with the piezoelectric layer 122 may be defined as the resonant portion 120. The resonant portion 120 may significantly interfere in passing of electric energy having an anti-resonant frequency while allowing electric energy near a resonant frequency to effectively pass therethrough. In other words, the resonant portion 120 may have a stop band with sharp skirt characteristics. Thus, the acoustic resonator 100b may be used as a high frequency filter with sharp skirt characteristics.

A resonant frequency of the resonant portion 120 becomes higher as an overall thickness of the resonant portion 120 is reduced. In other words, the acoustic resonator 100b may be used for a higher frequency band as a thickness of the resonant portion 120 is reduced.

However, when a thickness of the resonant portion 120 is significantly reduced, a resistance value of the upper electrode 124 and the lower electrode 126 may be increased according to a reduced thickness of the upper electrode 124 and the lower electrode 126, and conversion efficiency between electric energy and mechanical energy of the first active region 124a and the second active region 126a may be reduced. In this regard, insertion loss may be increased.

Thus, the acoustic resonator 100b provides a structure capable of reducing an overall resistance value, thereby increasing a resonant frequency while reducing insertion loss.

The first metal layer 140 includes a first resistance reduction region 140a electrically connected to the first extended region 124b of the upper electrode 124 and disposed on an upper portion of the first extended region 124b.

The second metal layer 160 includes a second resistance reduction region 160a electrically connected to the second extended region 126b of the lower electrode 126 and disposed on an upper portion of the second extended region 126b.

Accordingly, the first metal layer 140 and the second metal layer 160 may act as a resistor connected in parallel to the upper electrode 124 and the lower electrode 126, and thus an overall resistance value of the acoustic resonator 100b may be reduced.

The first metal layer 140 and the second metal layer 160 are disposed on the first extended region 124b and the second extended region 126b, thereby reducing an overall resistance value of the acoustic resonator 100b without substantially decreasing resonance efficiency of the resonant portion 120.

For example, each of the first metal layer 140 and the second metal layer 160 has resistivity lower than resistivity of each of the upper electrode 124 and the lower electrode 126, thereby further reducing an overall resistance value of the acoustic resonator 100b. For example, the first metal layer 140 and the second metal layer 160 may be formed of a material such as gold (Au), a gold-tin (Au—Sn) alloy, copper (Cu), a copper-tin (Cu—Sn) alloy, aluminum (Al), an aluminum (Al) alloy, or the like. For example, the aluminum alloy may be an aluminum-germanium (Al—Ge) alloy.

For example, each of the first metal layer 140 and the second metal layer 160 has a thickness greater than a thickness of each of the first extended region 124b of the upper electrode 124 and the second extended region 126b of the lower electrode 126 in a vertical direction (for example: z direction), thereby further reducing an overall resistance value of the acoustic resonator 100b.

The first resistance reduction region 140a and the second resistance reduction region 160a contribute relatively less to the reduction of the connection resistance between the resonant portion 120 and the first metal layer 140 and the second metal layer 160, as compared with a resistance value between the upper electrode 124, the lower electrode 126, the first metal layer 140, and the second metal layer 160. Thus, an electrical bottleneck may occur between the resonant portion 120, the first metal layer 140, and the second metal layer 160.

Thus, the first metal layer 140 further includes a first conductive link region 140b extended to correspond to (e.g., extend along) a portion of a side boundary of the first active region 124a and the second active region 126a from the first resistance reduction region 140a, and the second metal layer 160 further includes a second conductive link region 160b extended to correspond to (e.g., extend along) another portion of the side boundary of the first active region 124a and the second active region 126a from the second resistance reduction region 160a.

According to a reduction of connection resistance between the resonant portion 120, the first metal layer 140, and the second metal layer 160, an overall resistance value of the acoustic resonator 100b may be reduced in a balanced manner.

According to a balanced reduction in a resistance value, the electronic speed bottleneck in the acoustic resonator 100b may be significantly reduced, and insertion loss of the acoustic resonator 100b may be significantly reduced.

For example, as compared with the case in which only one of the first metal layer 140 and the second metal layer 160 includes a conductive link region, the first metal layer 140 and the second metal layer 160, including the first conductive link region 140b and the second conductive link region 160b, respectively, may reduce an overall resistance value of the acoustic resonator 100b in a more balanced manner. Thus, insertion loss of the acoustic resonator 100b may be further significantly reduced.

Additionally, the first metal layer 140 further includes a first protruding frame 140c protruding upwards (for example: z direction), and disposed over the first conductive link region 140b and the first resistance reduction region 140a to surround a portion of the first active region 124a and the second active region 126a, while the second metal layer 160 further includes a second protruding frame 160c protruding upwards (for example: z direction), and disposed over the second conductive link region 160b and the second resistance reduction region 160a to surround another portion of the first active region 124a and the second active region 126a. The first protruding frame 140c and the second protruding frame 160c may protrude by the insertion layer (380 of FIGS. 6, 7, and 8) disposed between the piezoelectric layer 122 and the upper electrode 124 or the lower electrode 126, although not relatively thick as compared with another portion of the first metal layer 140 and the second metal layer 160.

Figure 1B:
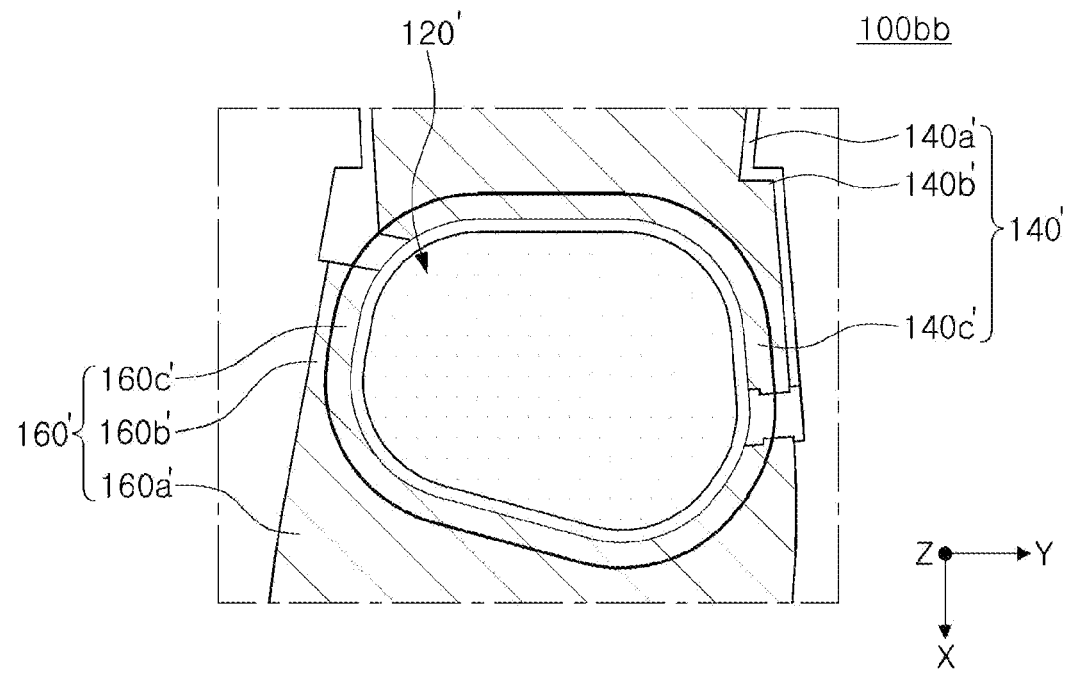
FIG. 1B is a plan view illustrating an additional form of an active region of an acoustic resonator, according to an embodiment.

FIG. 1B is a plan view illustrating an additional form of an active region of an acoustic resonator 100bb, according to an embodiment.

Referring to FIG. 1B, an acoustic resonator 100bb may include a circular resonant portion 120'. In other words, a shape of a resonant portion is not limited to the polygonal shape of the resonant portion 120 illustrated in FIG. 1A.

Accordingly, in the acoustic resonator 100bb, a first metal layer 140 including a first resistance reduction region 140a', a first conductive link region 140b', and a first protruding frame 140c may be shaped in accordance with the circular resonant portion 120'. Additionally, a second metal layer 160 including a second resistance reduction region 160a', a second conductive link region 160b', and a second protruding frame 160c may be shaped in accordance with the circular resonant portion 120'.

Figure 3A:
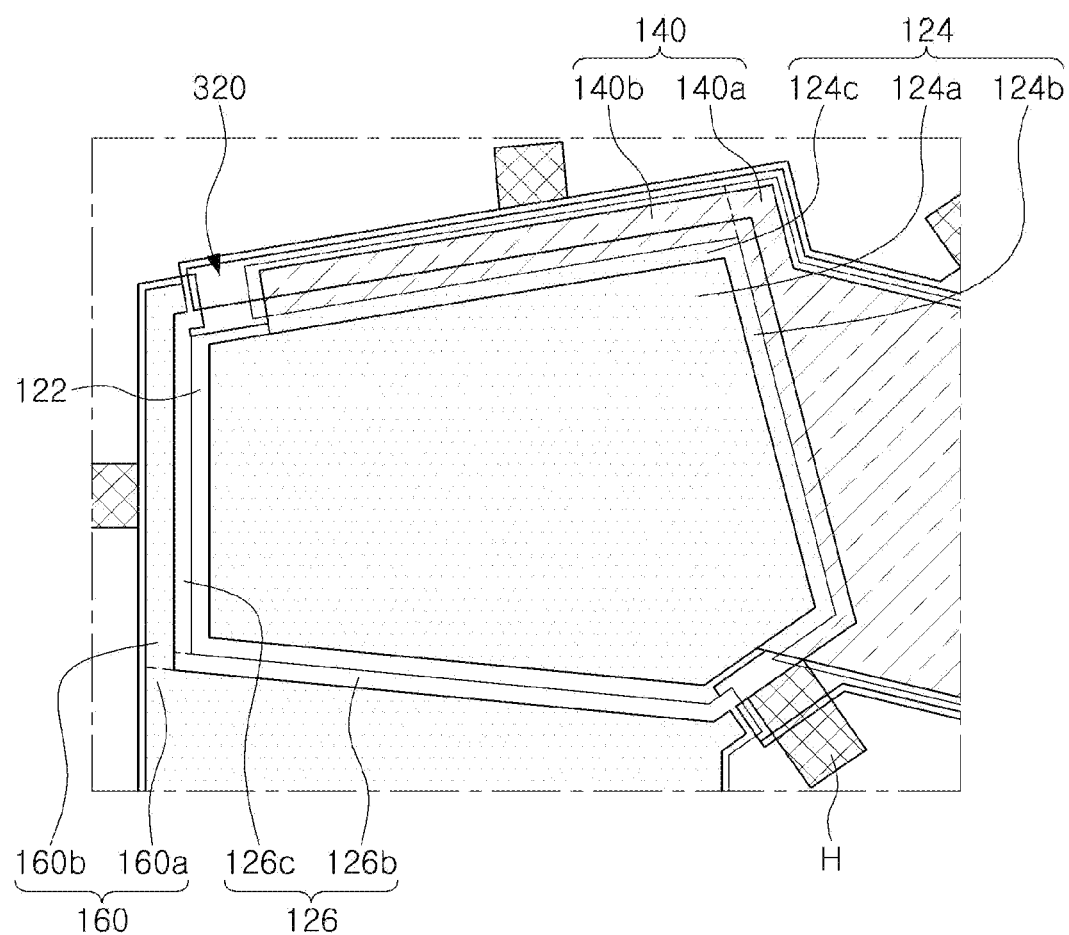
FIG. 3A is a plan view illustrating a curved connection structure of an acoustic resonator, according to an embodiment.
Figure 3B:
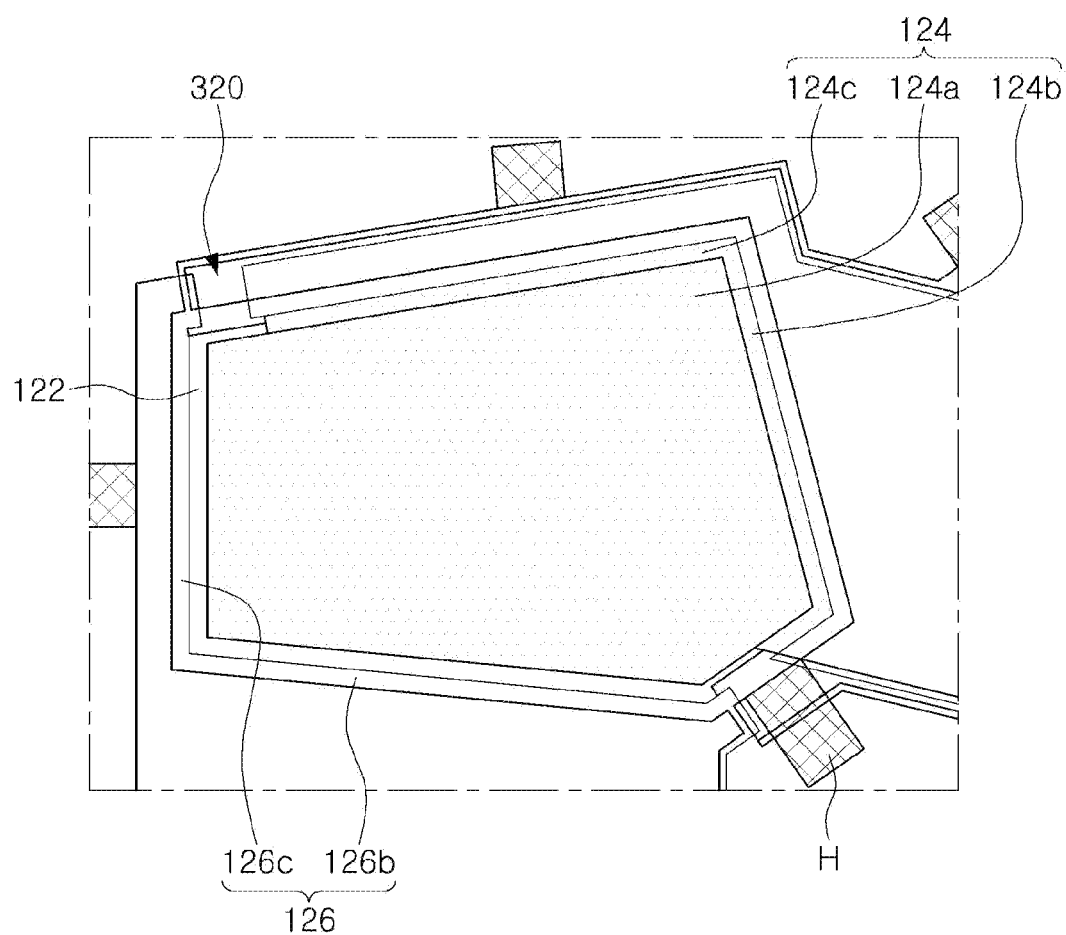
FIG. 3B is a plan view illustrating a structure in which first and second metal layers are omitted from the acoustic resonator of FIG. 3A, according to an embodiment.

FIG. 3A is a plan view illustrating a curved connection structure of an acoustic resonator, according to an embodiment, and FIG. 3B is a plan view illustrating a structure in which first and second metal layers are omitted from the acoustic resonator of FIG. 3A.

Referring to FIGS. 3A and 3B, the upper electrode 124 further includes a first expansion region 124c expanded from the first active region 124a in a third lateral direction, while the lower electrode 126 further includes a second expansion region 126c expanded from the second active region 126a in a fourth lateral direction. The first, second, third, and fourth lateral directions may be directions perpendicular to different sides of the polygonal shape of the first expansion region 124a.

The first conductive link region 140b of the first metal layer 140 may be in contact with the first expansion region 124c and may be disposed on an upper portion of the first expansion region 124c, while the second conductive link region 126b of the second metal layer 160 may be in contact with the second expansion region 126c and may be disposed on an upper portion of the second expansion region 126c.

Accordingly, the first conductive link region 140b and the second conductive link region 160b may reduce connection resistance between the upper electrode 124 and the first metal layer 140 and connection resistance between the lower electrode 126 and the second metal layer 160 in a balanced manner, while suppressing the physical interference in resonance of a resonant portion.

The first conductive link region 140b is extended to overlap a portion of a side boundary of the first active region 124a in a vertical direction, while the second conductive link region 160b may be extended to overlap another portion of the side boundary of the first active region 124a in a vertical direction.

Accordingly, the first conductive link region 140b and the second conductive link region 160b may be formed more easily and accurately in a manufacturing process, and thus may reduce connection resistance between the upper electrode 124 and the first metal layer 140, and connection resistance between the lower electrode 126 and the second metal layer 160 in a balanced manner, while suppressing the physical interference in resonance of a resonant portion.

In addition, the first conductive link region 140b has at least one bent form (e.g., bent portion), while the second conductive link region 160b may have at least one bent form (e.g., bent portion). Accordingly, the first conductive link region 140b and the second conductive link region 160b may have a shape adapted to a shape of a resonant portion, and thus may reduce connection resistance between the upper electrode 124 and the first metal layer 140 and connection resistance between the lower electrode 126 and the second metal layer 160 in a balanced manner while suppressing the physical interference in resonance of a resonant portion.

The sacrificial layer 320 and a hole H, illustrated in FIGS. 3A and 3B, may be used for formation of a cavity, which will be described later with reference to FIGS. 6 to 8. For example, etching gas is introduced into the sacrificial layer 320 through the hole H to etch the sacrificial layer 320, thereby forming a cavity.

Figure 4:
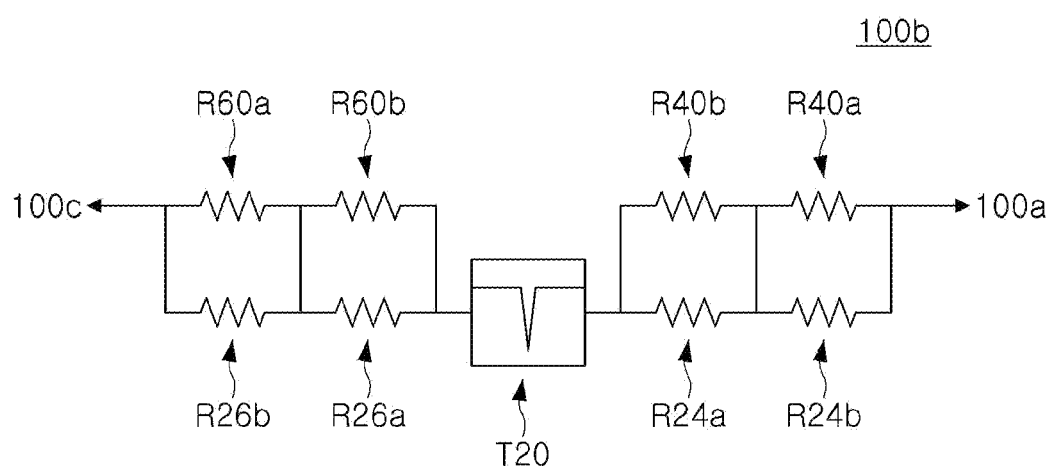
FIG. 4 is a view of an equivalent resistance circuit of an acoustic resonator, according to an embodiment.

FIG. 4 is a view of an equivalent resistance circuit of the acoustic resonator 100b, according to an embodiment.

Referring to FIG. 4, the acoustic resonator 100b is a second acoustic resonator that is connected between a first acoustic resonator 100a and a third acoustic resonator 100c, and may include a resonant portion T20.

Connection resistance of one end (for example: a right terminal) of the resonant portion T20 may be equal to first parallel resistance, formed of equivalent resistance R24a of a first active region of an upper electrode and equivalent resistance R40b of a first conductive link region of a first metal layer, and thus may be smaller than the equivalent resistance R24a of the first active region.

Connection resistance of the other end (for example: a left terminal) of the resonant portion T20 may be equal to second parallel resistance, formed of equivalent resistance R26a of a second active region of a lower electrode and equivalent resistance R60b of a second conductive link region of a second metal layer, and thus may be smaller than the equivalent resistance R26a of the second active region.

The second acoustic resonator 100b may reduce an overall resistance value according to a balanced distribution of the first parallel resistance and the second parallel resistance.

Extension resistance of one end of the resonant portion T20 may be equal to third parallel resistance, formed of equivalent resistance R24b of a first extended region of an upper electrode and equivalent resistance R40a of a first resistance reduction region of a first metal layer, while extension resistance of the other end of the resonant portion T20 may be equal to fourth parallel resistance, formed of equivalent resistance R26b of a second extended region of a lower electrode and equivalent resistance R60a of a second resistance reduction region of a second metal layer.

The second acoustic resonator 100b may reduce an overall resistance value according to a balanced distribution of the third parallel resistance and the fourth parallel resistance.

Thus, the second acoustic resonator 100b may reduce overall insertion loss.

Figure 5A:
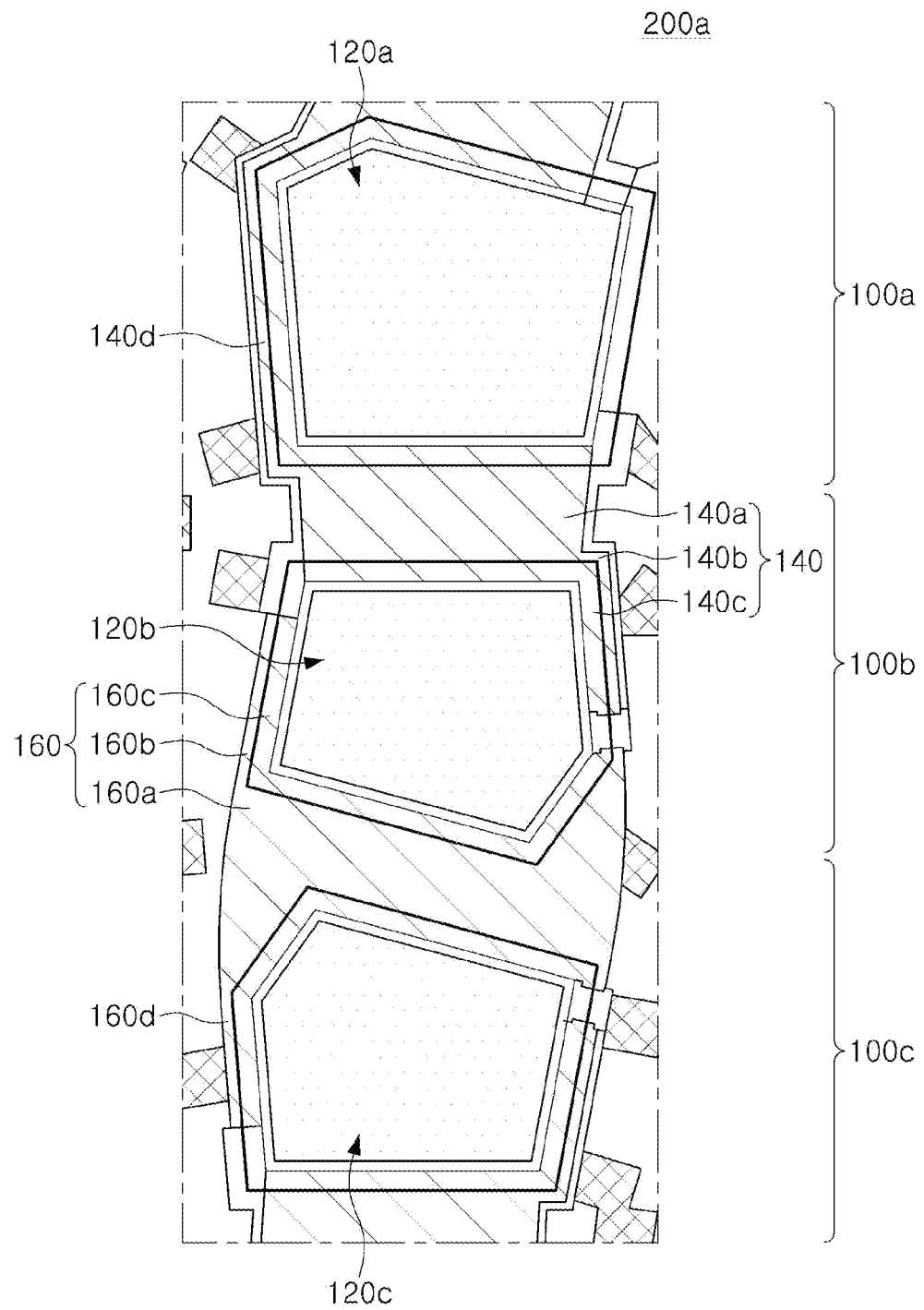
FIG. 5A is a plan view of an acoustic resonator filter, according to an embodiment.
Figure 5B:
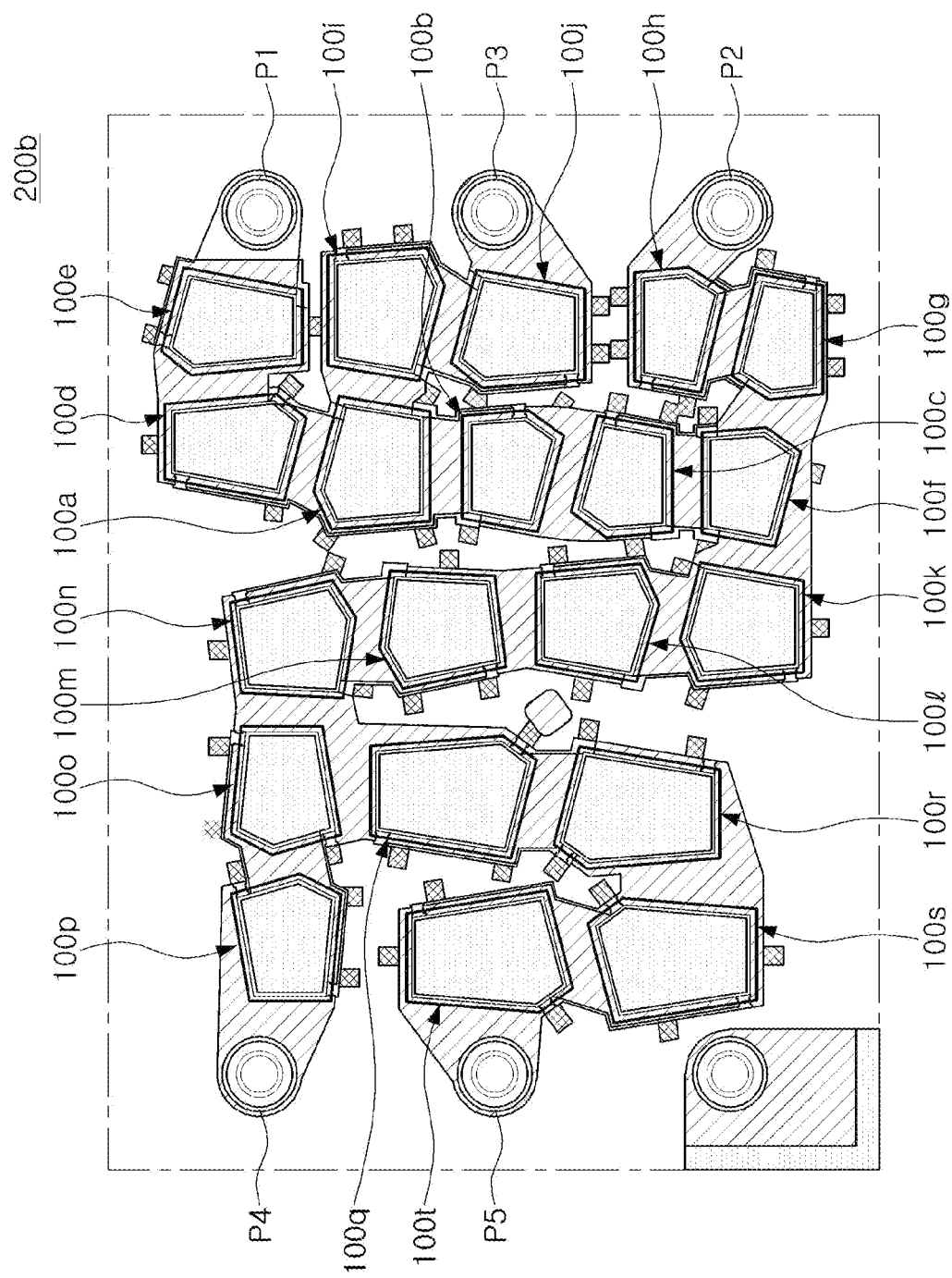
FIG. 5B is a plan view illustrating additional connections of an acoustic resonator of an acoustic resonator filter, according to an embodiment.

FIG. 5A is a plan view illustrating an acoustic resonator filter 200a, according to an embodiment. FIG. 5B is a plan view illustrating additional connections of an acoustic resonator of an acoustic resonator filter 200b, according to an embodiment.

Referring to FIG. 5A, the acoustic resonator filter 200a includes first, second, and third acoustic resonators 100a, 100b, and 100c.

The first, second, and third acoustic resonators 100a, 100b, and 100c may be electrically connected to each other, each of the first, second, and third acoustic resonators 100a, 100b, and 100c may be designed in the same manner as the acoustic resonator described above with reference to FIGS. 1A to 4, and the first, second, and third acoustic resonators 100a, 100b, and 100c may include first, second, and third resonant portions 120a, 120b, and 120c, respectively.

The first metal layer 140 of the second acoustic resonator 100b further includes a third conductive link region 140d surrounding a portion of the first resonant portion 120a of the first acoustic resonator 100a, while the second metal layer 160 of the second acoustic resonator 100b further includes a fourth conductive link region 160d surrounding a portion of the third resonant portion 120c of the third acoustic resonator 100c.

In other words, respective metal layers of the first, second, and third acoustic resonators 100a, 100b, and 100c may have shared characteristics. Accordingly, the acoustic resonator filter 200a may have a reduced size overall by more compactly arranging the first, second, and third acoustic resonators 100a, 100b, and 100c, and may have reduced insertion loss by reducing an overall resistance value of metal layers.

Additionally, one of the first and third conductive link regions 140b and 140d may surround a corresponding active region clockwise and the other one may surround a corresponding active region counterclockwise, while one of the second and fourth conductive link regions 160b and 160d may surround a corresponding active region clockwise and the other one may surround a corresponding active region counterclockwise. For example, the first and third conductive link regions 140b and 140d may be disposed at opposite sides among sides of the first resistance reduction region 140a extending in the first and second lateral directions, and the second and fourth conductive link regions 160b and 160d may be disposed at a same side of the second resistance reduction region 160a extending in the first and second lateral directions.

Accordingly, since each of the first metal layer 140 and the second metal layer 160 may have a resistance value balanced to the left and right, an electronic speed bottleneck occurring in each of the first metal layer 140 and the second metal layer 160 may be further reduced. In other words, the acoustic resonator filter 200a is configured to distribute an overall resistance value in a more balanced manner, thereby reducing overall insertion loss.

Referring to FIG. 5B, the acoustic resonator filter 200b further includes additional acoustic resonators 100d, 100e, 100f, 100g, 100h, 100i, 100j, 100k, 100l, 100m, 100n, 100o, 100p, 100q, 100r, 100s, and 100t, electrically connected to the first, second, and third acoustic resonators 100a, 100b, and 100c, and may be electrically connected to first, second, third, fourth, and fifth ports P1, P2, P3, P4, and P5.

The acoustic resonator filter 200b according to an embodiment may have not only characteristics of a notch filter but also characteristics of a bandpass filter according to a connection structure of acoustic resonators, and may increase a bandwidth of a bandpass filter.

Figure 6:
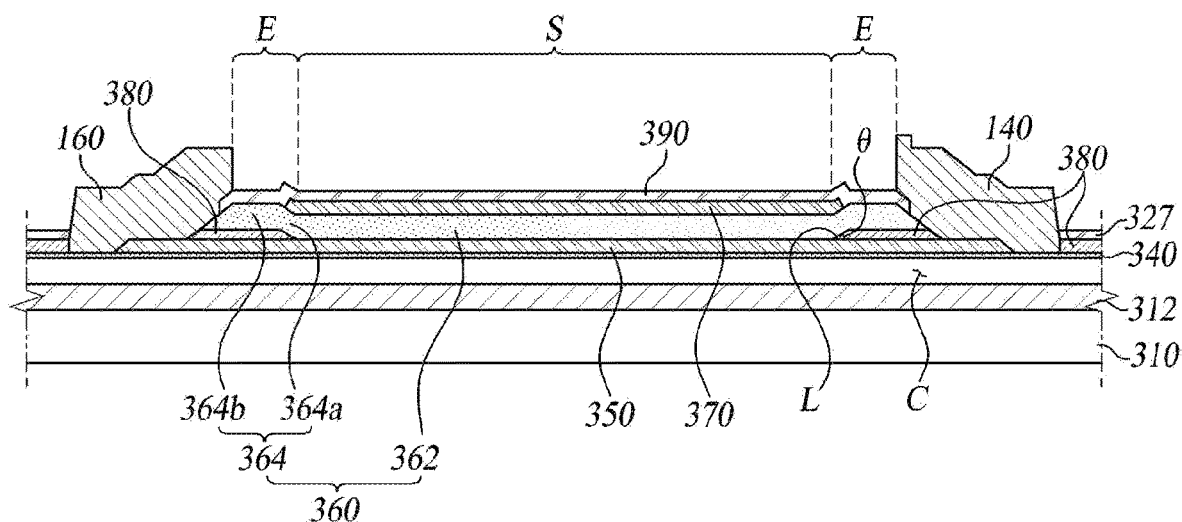
FIGS. 6 to 8 are cross-sectional views illustrating peripheral features of an acoustic resonator, according to an embodiment.
Figure 7:
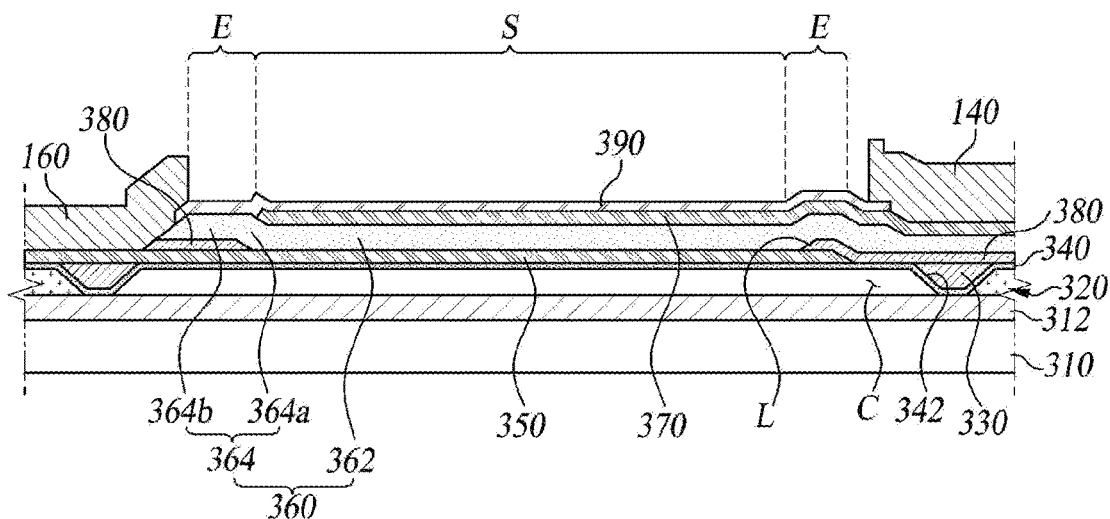
Figure 8:
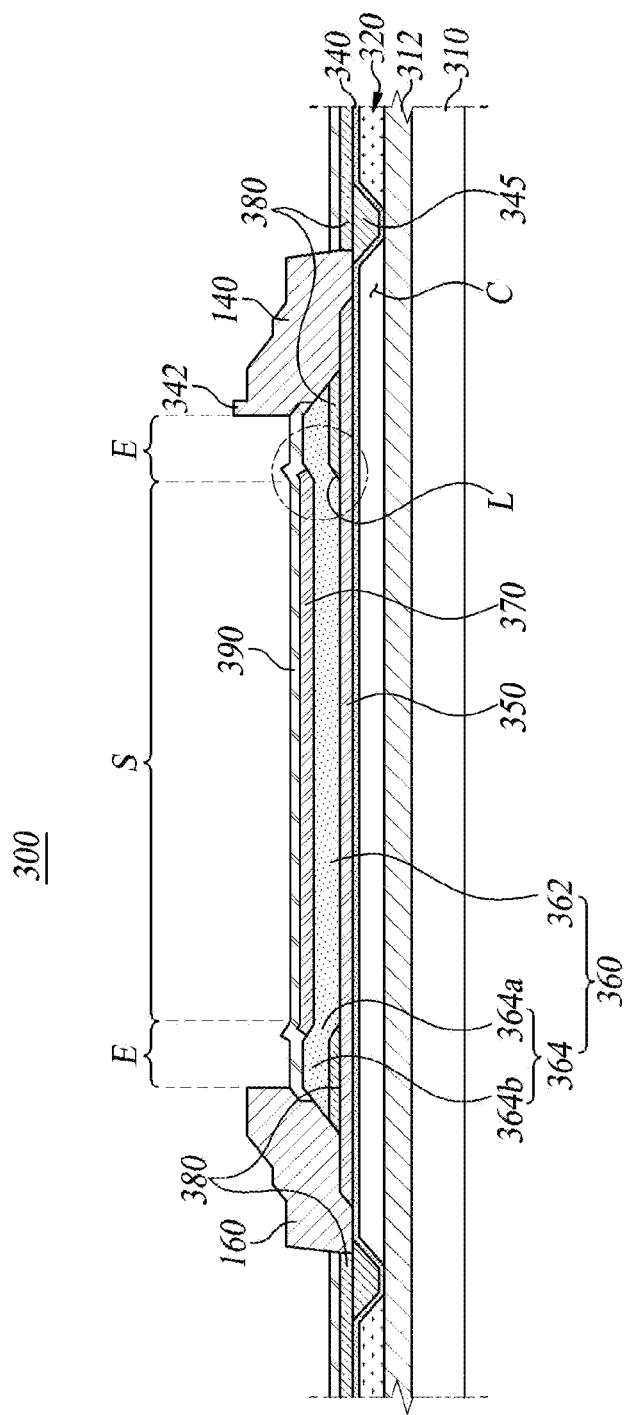

FIGS. 6 to 8 are cross-sectional views illustrating peripheral features of an acoustic resonator, according to an embodiment.

Referring to FIGS. 6 to 8, a resonant portion 300 may include a sacrificial layer 320, an etch stop portion 330, a membrane layer 340, a lower electrode 350, a piezoelectric layer 360, an upper electrode 370, an insertion layer 380, and a passivation layer 390, by way of example.

A silicon wafer or a silicon-on-insulator (SOI) substrate may be used as the substrate 310.

An insulating layer 312 may be disposed on an upper surface of the substrate 310 to electrically isolate the substrate 310 and the resonant portion 300 from each other. Additionally, the insulating layer 312 may prevent the substrate 310 from being etched by an etching gas, when a cavity C is formed during a method of manufacturing an acoustic resonator.

For example, the insulating layer 312 may be formed of any one or any combination of any two or more of silicon dioxide ($SiO_2$), silicon nitride ($Si_3N_4$), aluminum oxide ($Al_2O_2$), and aluminum nitride (AlN), and may be formed on the substrate 310 through one process among thermal oxidation, chemical vapor deposition, radio frequency (RF) magnetron sputtering, and evaporation.

The sacrificial layer 320 is formed on the insulating layer 312 of the substrate 310, and the cavity C and the etch stop portion 330 may be disposed in the sacrificial layer 320. The cavity C is formed by removing a portion of the sacrificial layer 320 during manufacturing. As described above, since the cavity C is formed in the sacrificial layer 320, the lower electrode 350, which is formed on an upper portion of the sacrificial layer 320, may be formed to be flat. For example, the sacrificial layer 320 may be formed of a material that can be easily etched, such as polysilicon or a polymer, but is not limited to these examples.

The etch-stop portion 330 may be disposed along a boundary of the cavity C. The etch-stop portion 330 may prevent etching from proceeding into a cavity region during formation of the cavity C. The etch-stop portion 330 may be formed of a material that is the same as a material of the insulating layer 312, but is not limited thereto.

The membrane layer 340 may form the cavity C together with the substrate 310. The membrane layer 340 may be formed of a material having a low reactivity with an etching gas (for example, a halide such as fluorine (F), chlorine (Cl), or the like, and xenon difluoride ($XeF_2$)), when the sacrificial layer 320 is removed. The etch-stop portion 330 is inserted into a groove portion 342 formed by the membrane layer 340. The membrane layer 340 may be formed of a dielectric layer containing any one material among silicon nitride ($Si_3N_4$), silicon oxide ($SiO_2$), manganese oxide (MgO), zirconium oxide ($ZrO_2$), aluminum nitride (AlN), lead zirconate titanate (PZT), gallium arsenide (GaAs), hafnium oxide ($HfO_2$), aluminum oxide ($Al_2O_3$), titanium oxide ($TiO_2$), and zinc oxide (ZnO).

A seed layer (not shown), formed of aluminum nitride (AlN), may be formed on the membrane layer 340. That is, the seed layer may be disposed between the membrane layer 340 and the lower electrode 350. The seed layer may be formed using a dielectric or metal, having a hexagonal close packed (HCP) crystal structure, in addition to aluminum nitride (AlN). As an example, when the seed layer is formed of the metal, the seed layer may be formed of titanium (Ti).

The lower electrode 350 is formed on the membrane layer 340, and a portion of the lower electrode 350 may be disposed in an upper portion of the cavity C.

The piezoelectric layer 360 may be formed to cover at least the lower electrode 350, disposed in an upper portion of the cavity C.

Meanwhile, the piezoelectric layer 360 may include a piezoelectric portion 362 disposed in a flat portion S, and a bent portion 364 disposed in an expansion portion E.

The piezoelectric portion 362 is, for example, a portion directly stacked on an upper surface of the lower electrode 350. Thus, the piezoelectric portion 362 is interposed between the lower electrode 350 and the upper electrode 370 and provided to have a flat shape together with the lower electrode 350 and the upper electrode 370.

The bent portion 364 may be a region extended outwardly from the piezoelectric portion 362, and located within the expansion portion E.

The bent portion 364 is disposed on the insertion layer 380, which will be described later, and is formed to have a shape which rises along a shape of the insertion layer 380. The piezoelectric layer 360 is curved at a boundary between the piezoelectric portion 362 and the bent portion 364, and the bent portion 364 rises to correspond to a thickness and a shape of the insertion layer 380.

The bent portion 364 may include an inclined portion 364a and an extended portion 364b.

The inclined portion 364a is a portion formed to be inclined along an inclined surface L of the insertion layer 380, to be described later. The extended portion 364b is a portion extended outwardly from the inclined portion 364a.

The inclined portion 364a is formed parallel to the inclined surface L of the insertion layer 380, and an inclination angle of the inclined portion 364a may be equal to an inclination angle ($\theta$ of FIG. 6) of the inclined surface L of the insertion layer 380.

The upper electrode 370 may be formed to cover at least a portion of the piezoelectric layer 360 disposed on an upper portion of the cavity C.

The insertion layer 380 may be disposed between the lower electrode 350 and the piezoelectric layer 360. The insertion layer 380 may be formed of a dielectric material such as silicon oxide ($SiO_2$), aluminum nitride (AlN), aluminum oxide ($Al_2O_3$), silicon nitride ($Si_3N_4$), manganese oxide (MgO), zirconium oxide ($ZrO_2$), lead zirconate titanate (PZT), gallium arsenide (GaAs), oxide hafnium ($HfO_2$), aluminum oxide ($Al_2O_3$), titanium oxide ($TiO_2$), zinc oxide (ZnO), or the like, and may be formed of a material different from that of the piezoelectric layer 360. If necessary, a region provided with the insertion layer 380 may be provided as an empty space (air). The region described above may be implemented by removing the insertion layer 380 in a manufacturing process.

In an embodiment, a thickness of the insertion layer 380 may be formed to be equal to or similar to a thickness of the lower electrode 350. The thickness of the insertion layer may be formed to be similar to that of the piezoelectric layer 360 or less than that of the piezoelectric layer 360. For example, the insertion layer 380 is formed to have a thickness of 100 Å or more, and may be formed to have a thickness less than a thickness of the piezoelectric layer 360. The disclosure is not, however, limited to the foregoing examples.

The insertion layer 380 may be disposed along a surface formed by the membrane layer 340, the lower electrode 350, and the etch-stop portion 330.

The insertion layer 380 is disposed around the flat portion S and may support the bent portion 364 of the piezoelectric layer 360. Thus, the bent portion 364 of the piezoelectric layer 360 may include the inclined portion 364a and the extended portion 364b, along a shape of the insertion layer 380.

The insertion layer 380 may be disposed in a region except for the flat portion S. For example, the insertion layer 380 may be disposed in the entirety of a region excluding the flat portion S, or in some regions excluding the flat portion S.

At least a portion of the insertion layer 380 may be disposed between the piezoelectric layer 360 and the lower electrode 350.

A side surface of the insertion layer 380 disposed along a boundary of the flat portion S may be formed to have a shape having a thickness which becomes thicker far away from the flat portion S. Thus, the insertion layer 380 may have a side surface disposed adjacent to the flat portion S that is an inclined surface L having a constant inclination angle θ.

In order to manufacture a configuration in which the inclination angle θ of the side surface of the insertion layer 380 is formed to be less than 5°, a thickness of the insertion layer 380 is required to be significantly small, or an area of the inclined surface L is required to be significantly large. Hence, there is difficulty in implementing such a configuration.

Additionally, if the inclination angle θ of the side surface of the insertion layer 380 is greater than 70°, the inclination angle of the inclined portion 364a of the piezoelectric layer 360, which is stacked on the insertion layer 380, may be formed greater than 70°. In this case, the piezoelectric layer 360 is excessively bent, so cracking may occur in a curved portion of the piezoelectric layer 360.

Thus, in an example, the inclination angle θ of the inclined surface L is formed in a range of greater than or equal to 5° and less than or equal to 70°. However, the inclination angle θ is not limited to such an example.

The passivation layer 390 may be formed in a region except for a portion of the lower electrode 350 and the upper electrode 370. The passivation layer 390 may prevent the upper electrode 370 and the lower electrode 350 from being damaged during a manufacturing process.

Furthermore, a portion of the passivation layer 390 may be removed by etching in order to control frequency in a final process during manufacturing. In other words, a thickness of the passivation layer 390 may be adjusted. The passivation layer 390 may be formed of a dielectric layer containing any one material among silicon nitride ($Si_3N_4$), silicon oxide ($SiO_2$), manganese oxide (MgO), zirconium oxide ($ZrO_2$), aluminum nitride (AlN), lead zirconate titanate (PZT), gallium arsenide (GaAs), hafnium oxide ($HfO_2$), aluminum oxide ($Al_2O_3$), titanium oxide ($TiO_2$), and zinc oxide (ZnO), by way of example.

As set forth above, according to an embodiment disclosed herein, an acoustic resonator and an acoustic resonator filter may reduce an overall resistance value in a balanced manner to reduce insertion loss, and may have low insertion loss while having a high resonant frequency.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An acoustic resonator filter, comprising:
   first, second, and third acoustic resonators electrically connected to each other, wherein the second acoustic resonator includes:
   a piezoelectric layer;
   an upper electrode comprising a first active region disposed on an upper portion of the piezoelectric layer, and a first extended region extended from the first active region in a first lateral direction;
   a lower electrode comprising a second active region disposed on a lower portion of the piezoelectric layer, and a second extended region extended from the second active region in a second lateral direction;
   a first metal layer comprising a first resistance reduction region electrically connecting the first extended region of the upper electrode to the first acoustic resonator and disposed on an upper portion of the first extended region, and a first conductive link region extended from the first resistance reduction region and corresponding to a portion of a side boundary of the first and second active regions; and
   a second metal layer comprising a second resistance reduction region electrically connecting the second extended region of the lower electrode to the third acoustic resonator, and disposed on an upper portion of the second extended region, and a second conductive link region extended from the second resistance reduction region and corresponding to another portion of the side boundary of the first and second active regions,
   the first and second metal layers are disposed entirely outside a central area of the first and second active regions, and, in combination, are disposed on all of sides of a resonant portion of the second acoustic resonator, and each of the first metal layer and the second metal layer is disposed along a respective plurality of sides of the resonant portion constituting less than all of the sides of the resonant portion.

2. The acoustic resonator filter of claim 1, wherein the first metal layer further comprises a third conductive link region surrounding a portion of an active region of the first acoustic resonator, and
   wherein the second metal layer further comprises a fourth conductive link region surrounding a portion of an active region of the third acoustic resonator.

3. The acoustic resonator filter of claim 2, wherein the first and third conductive link regions are disposed at opposite sides among sides of the first resistance reduction region extending in the first and second lateral directions, and
   wherein the second and fourth conductive link regions are disposed at a same side of the second resistance reduction region extending in the first and second lateral directions.

4. The acoustic resonator filter of claim 1, wherein each of the first metal layer and the second metal layer has a thickness in a vertical direction that is greater than a thickness of each of the first extended region and the second extended region in the vertical direction.

5. An acoustic resonator, comprising:
   a piezoelectric layer;
   an upper electrode comprising a first active region disposed on an upper portion of the piezoelectric layer, and a first extended region extended from the first active region in a first lateral direction;

a lower electrode comprising a second active region disposed on a lower portion of the piezoelectric layer, and a second extended region extended from the second active region in a second lateral direction;

a first metal layer comprising a first resistance reduction region electrically connected to the first extended region of the upper electrode and disposed on an upper portion of the first extended region; and a second metal layer comprising a second resistance reduction region electrically connected to the second extended region of the lower electrode and disposed on an upper portion of the second extended region, wherein the first metal layer further comprises a first conductive link region extended to correspond to a portion of a side boundary of the first and second active regions from the first resistance reduction region, wherein the second metal layer further comprises a second conductive link region extended to correspond to another portion of the side boundary of the first and second active regions from the second resistance reduction region, and wherein the first and second metal layers are disposed entirely outside a central area of the first and second active regions, and, in combination, are disposed on all of sides of a resonant portion of the acoustic resonator, and each of the first metal layer and the second metal layer is disposed along a respective plurality of sides of the resonant portion constituting less than all of the sides of the resonant portion.

6. The acoustic resonator of claim 5, wherein the upper electrode further comprises a first expansion region expanded from the first active region in a third lateral direction, wherein the lower electrode further comprises a second expansion region expanded from the second active region in a fourth lateral direction, wherein the first conductive link region of the first metal layer is in contact with the first expansion region, and is disposed on an upper portion of the first expansion region, and wherein the second conductive link region of the second metal layer is in contact with the second expansion region, and is disposed on an upper portion of the second expansion region.

7. The acoustic resonator of claim 5, wherein the first conductive link region is extended to overlap a portion of a side boundary of the first and second active regions, and wherein the second conductive link region is extended to overlap another portion of the side boundary of the first and second active regions.

8. The acoustic resonator of claim 5, wherein each of the first and second active regions has a polygonal shape, and each of the first and second conductive link regions surrounds different sides of the polygonal shape.

9. The acoustic resonator of claim 5, wherein the first conductive link region has at least one bent form, and wherein the second conductive link region has at least one bent form.

10. The acoustic resonator of claim 5, wherein resistivity of the first metal layer is lower than resistivity of the upper electrode, and wherein resistivity of the second metal layer is lower than resistivity of the lower electrode.

11. The acoustic resonator of claim 5, wherein a thickness, in a vertical direction, of the first resistance reduction region of the first metal layer is greater than a thickness, in the vertical direction, of the first extended region of the upper electrode, and wherein a thickness, in the vertical direction, of the second resistance reduction region of the second metal layer is greater than a thickness, in the vertical direction, of the second extended region of the lower electrode.

12. The acoustic resonator of claim 5, further comprising:

an insertion layer disposed between the piezoelectric layer and the upper electrode, or between the piezoelectric layer and the lower electrode.

13. The acoustic resonator of claim 5, further comprising:

a substrate disposed on a lower portion of the lower electrode;

a membrane layer disposed between the substrate and the lower electrode to form a cavity between the substrate and the lower electrode; and an etch stop portion disposed on lower portions of the first and second metal layers outside the cavity.

14. The acoustic resonator of claim 5, wherein the first metal layer further comprises a first frame protruding in a vertical direction, and disposed over the first conductive link region and the first resistance reduction region to at least partially surround the first and second active regions, and wherein the second metal layer further comprises a second frame protruding in the vertical direction, and disposed over the second conductive link region and the second resistance reduction region to at least partially surround the first and second active regions.

* * * * *